(12) United States Patent
Silva

(10) Patent No.: US 12,057,255 B2
(45) Date of Patent: Aug. 6, 2024

(54) HYBRID TRANSFORMERS FOR POWER SUPPLIES

(71) Applicant: AcLeap Power Inc., Taipei (TW)

(72) Inventor: Arturo Silva, Allen, TX (US)

(73) Assignee: ACLEAP POWER INC., Taipei (TW)

( * ) Notice: Subject to any disclaimer, the term of this patent is extended or adjusted under 35 U.S.C. 154(b) by 732 days.

(21) Appl. No.: 16/701,098

(22) Filed: Dec. 2, 2019

(65) Prior Publication Data

US 2021/0166860 A1 Jun. 3, 2021

(51) Int. Cl.
| | |
|---|---|
| *H05K 1/02* | (2006.01) |
| *H01F 5/00* | (2006.01) |
| *H01F 17/00* | (2006.01) |
| *H01F 27/06* | (2006.01) |
| *H01F 27/24* | (2006.01) |
| *H01F 27/28* | (2006.01) |
| *H01F 27/32* | (2006.01) |
| *H01F 27/36* | (2006.01) |
| *H01F 41/12* | (2006.01) |
| *H05K 1/16* | (2006.01) |
| *H05K 1/18* | (2006.01) |
| *H05K 3/30* | (2006.01) |

(52) U.S. Cl.
CPC .......... *H01F 27/2823* (2013.01); *H01F 27/06* (2013.01); *H01F 27/24* (2013.01); *H01F 27/32* (2013.01); *H01F 41/12* (2013.01); *H05K 1/181* (2013.01); *H05K 3/303* (2013.01); *H01F 2027/065* (2013.01); *H05K 2201/1003* (2013.01)

(58) Field of Classification Search
CPC .. H05K 1/02; H05K 1/16; H05K 1/18; H05K 1/165; H05K 1/181; H05K 1/185; H05K 3/303; H01F 5/00; H01F 17/00; H01F 17/0013; H01F 27/06; H01F 27/24; H01F 27/28; H01F 27/32; H01F 27/36; H01F 27/289; H01F 27/324; H01F 27/327; H01F 27/2804; H01F 27/2823; H01F 27/2847
USPC ...... 336/199, 84 C, 107, 116, 138, 180, 192, 336/200
See application file for complete search history.

(56) References Cited

U.S. PATENT DOCUMENTS

| | | | | |
|---|---|---|---|---|
| 4,639,696 | A * | 1/1987 | Murata | H03H 7/32 333/140 |
| 6,075,433 | A * | 6/2000 | Ono | H02J 50/10 336/212 |
| 6,147,583 | A * | 11/2000 | Rinne | H01F 27/2847 336/200 |
| 6,489,876 | B1 * | 12/2002 | Jitaru | H01F 27/2866 336/200 |
| 8,258,910 | B2 * | 9/2012 | Herhold | H05K 1/0256 336/200 |
| 8,446,243 | B2 * | 5/2013 | Strzalkowski | H01F 27/2804 336/200 |

(Continued)

*Primary Examiner* — Xiaoliang Chen
(74) *Attorney, Agent, or Firm* — McCarter & English, LLP

(57) ABSTRACT

Illustrative embodiments of hybrid transformers, power supplies, and methods relating to the same are disclosed. In at least one embodiment, a hybrid transformer includes first and second wire coils arranged on opposing surfaces of a printed circuit board (PCB), a core extending through the PCB, wherein the first and second coils are each wound around the core, and at least one header electrically coupling one of the first and second wire coils to the PCB.

10 Claims, 20 Drawing Sheets

(56) References Cited

U.S. PATENT DOCUMENTS

| | | | | |
|---|---|---|---|---|
| 9,433,043 | B1* | 8/2016 | Hanz | H05B 45/382 |
| 11,424,066 | B2* | 8/2022 | Ogawa | H01F 27/2804 |
| 2002/0167388 | A1* | 11/2002 | Usui | H01F 27/2804 |
| | | | | 336/200 |
| 2008/0297297 | A1* | 12/2008 | Lin | H01F 27/2847 |
| | | | | 336/200 |
| 2009/0045901 | A1* | 2/2009 | Tsai | H01F 27/2847 |
| | | | | 336/173 |
| 2010/0079229 | A1* | 4/2010 | Koprivnak | H01F 27/29 |
| | | | | 336/200 |
| 2010/0079233 | A1* | 4/2010 | Koprivnak | H01F 27/2804 |
| | | | | 336/200 |
| 2011/0140824 | A1* | 6/2011 | Herhold | H01F 27/2804 |
| | | | | 336/200 |
| 2012/0154095 | A1* | 6/2012 | Li | H01F 27/325 |
| | | | | 336/199 |
| 2013/0027165 | A1* | 1/2013 | Lin | H01F 27/2866 |
| | | | | 336/192 |
| 2013/0301312 | A1* | 11/2013 | Konishi | H02M 3/33573 |
| | | | | 363/21.15 |
| 2014/0097926 | A1* | 4/2014 | Ono | H01F 17/0013 |
| | | | | 336/200 |
| 2014/0347159 | A1* | 11/2014 | Zuo | H01F 27/24 |
| | | | | 336/84 C |
| 2015/0062951 | A1* | 3/2015 | Nishikawa | H05B 47/00 |
| | | | | 362/546 |
| 2015/0093924 | A1* | 4/2015 | Villarreal | H01F 27/306 |
| | | | | 439/95 |
| 2017/0148560 | A1* | 5/2017 | Yoon | H05K 1/181 |
| 2017/0200552 | A1* | 7/2017 | Chung | H01F 27/2885 |
| 2018/0040410 | A1* | 2/2018 | Hamada | H05K 1/0262 |
| 2018/0144858 | A1* | 5/2018 | Oguchi | H01F 27/2823 |
| 2018/0286549 | A1* | 10/2018 | Kim | H01F 27/32 |
| 2019/0019618 | A1* | 1/2019 | Fukui | H05K 1/165 |
| 2019/0097458 | A1* | 3/2019 | Oh | H02J 50/12 |
| 2019/0103210 | A1* | 4/2019 | Elferich | H05K 1/165 |
| 2019/0371514 | A1* | 12/2019 | Ogawa | H01F 27/24 |
| 2020/0267871 | A1* | 8/2020 | Takahara | H01F 27/24 |
| 2020/0350111 | A1* | 11/2020 | Sizov | H02M 1/12 |
| 2021/0185817 | A1* | 6/2021 | Fujii | H05K 1/165 |
| 2021/0195728 | A1* | 6/2021 | Hiraoka | H05K 3/284 |
| 2021/0272735 | A1* | 9/2021 | Aikawa | H01F 27/2804 |
| 2022/0059275 | A1* | 2/2022 | Lee | H05K 1/165 |

* cited by examiner

HYBRID TRANSFORMERS FOR POWER SUPPLIES

TECHNICAL FIELD

The present subject matter relates to power supplies and, more particularly, to hybrid transformers therefor.

BACKGROUND

Often times, electronics and other applications call for power characteristics that are different from available power sources. Converters, transformers, and/or combinations thereof address the problem of mismatched power sources and power needs. A converter is an electronic circuit or electromechanical device that converts a source of direct current (DC) from one voltage level to another. A transformer is conventionally utilized to increase or decrease the alternating voltages in electric power applications. However, power conversion may be costly, in terms of component size, expense, noise introduction, manufacturing time, power consumption, thermal load, etc.

Power supplies that call for high input voltage and yield lower output voltage entail transformers with high primary to secondary turns ratios. Exemplary power supplies may be from 420V DC to 360V DC converted to 54V DC, 24V DC or 12V DC. Isolated DC-DC converters such as 54V DC converted to 12V or 10V DC have conventionally involved lower turns ratios. Further, such conventional low turns ratio transformers were frequently developed using planar transformers having both primary and secondary transformer windings disposed on high count, multilayer printed wiring boards (PWBs) or printed circuit boards (PCBs). The advances contemplated by the present disclosure take advantage of resonant topology and hybrid technologies to improve power density, decrease material usage, decrease cost, and improve efficiency.

Conventionally, transformer coils have been manufactured directly into the material of a PCB. A multilayer PCB with reinforced isolation between each turn of a coil requires approximately six weeks to manufacture. The manufacturing time and complexity results from safety requirements necessitating thick, three-layer, 16 millimeter dielectric layers separating the coil. Growing these dielectric layers is time consuming and labor intensive. A solution, like that described in the below disclosure, utilizing a surface mounted wire coil represents an improvement in the art because such a design reduces cost, accelerates time to market, and improves efficiency for DC-DC converters.

The description provided in the background section should not be assumed to be prior art merely because it is mentioned in or associated with the background section. The background section may include information that describes one or more aspects of the subject technology.

SUMMARY

According to an aspect of the present disclosure, a hybrid transformer may include first and second wire coils arranged on opposing surfaces of a printed circuit board (PCB), a core extending through the PCB, wherein the first and second coils are each wound around the core, and at least one header electrically coupling one of the first and second wire coils to the PCB.

According to another aspect of the present disclosure, a method of assembling a hybrid transformer, the method may include coupling a first wound conductor to a first surface of a printed circuit board (PCB), coupling a second wound conductor to an opposing second surface of the PCB, and positioning a core such that a central limb of the core extends through the first wound conductor, the second wound conductor, and the PCB.

Yet another aspect of the present disclosure describes a power supply may include a printed circuit board (PCB), a hybrid transformer, and a header. The hybrid transformer may include a core, a first coil, and second coil, wherein the first coil comprises a first wire and a first insulating material wound into the first coil and surface mounted to the PCB, and the header electrically coupling the first coil to the PCB.

Other aspects and advantages of the present embodiments will become apparent upon consideration of the following detailed description and the attached drawings wherein like numerals designate like structures throughout the specification.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Still further, modules and components depicted may be combined, in whole or in part, and/or divided, into one or more different parts, as applicable to fit particular implementations without departing from the scope of the present disclosure. Accordingly, the drawings and description are to be regarded as illustrative in nature and not restrictive.

Figure 1:
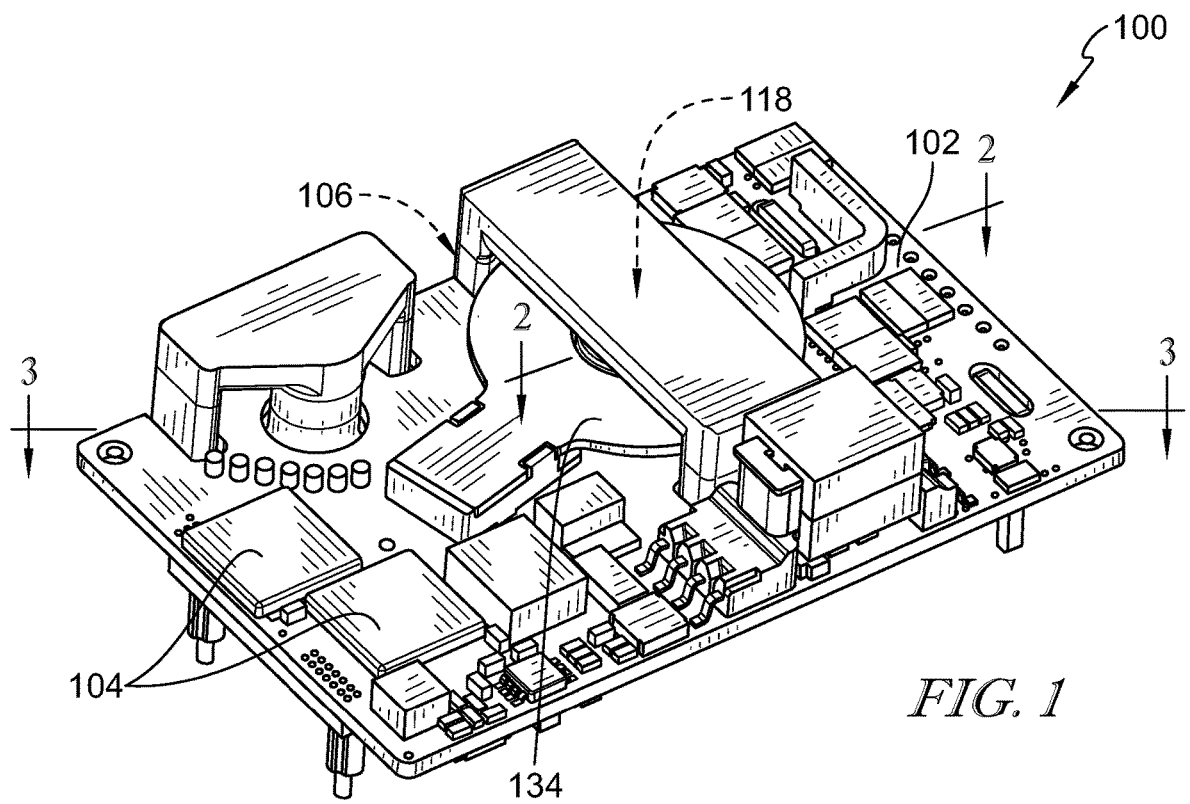
FIG. 1 illustrates a high density isolated hybrid transformer for DC-DC converters.

With reference to FIGS. 1-24, a high density isolated hybrid transformer 100 for DC-DC converters is described. The hybrid transformer 100 is designed for electrical applications, such as power supplies, that call for relatively high input voltages and relatively low output voltages, e.g., 415V DC to 380V DC converted to 54V DC, 24V DC or 12V DC. The hybrid transformer 100 may facilitate improved power density, decreased material usage, decreased expense, decreased time to market, improved customization, and improved efficiency, as compared with conventional transformers for high voltage input Referring now to FIGS. 1-3, the hybrid transformer 100 is shown disposed on a PCB 102 along with a number of other electrical components 104. The hybrid transformer 100 comprises first and second coils 106, 108 disposed on first and second sides 110, 112 of the PCB 102. First and second insulators 114, 116 are disposed adjacent the first and second coils 106, 108 axially distal from the PCB 102. In the exemplary embodiment of FIGS. 2 and 3, the PCB 102, first and second coils 106, 108, and first and second insulators 114, 116 are stacked according to the following order: the first insulator 114, the first coil 106, the PCB 102, the second coil 108, and the second insulator 116. In other words, the first and second insulators 114, 116 sandwich the first coil 106, the PCB 102, and the second coil 108. An interior opening or passageway 118 is disposed within the first and second coils 106, 108, the first and second insulators 114, 116, and the PCB 102. A core 120 is disposed within the interior opening 118 and passes through each of the coils 106, 108, insulators 114, 116, and the PCB 102. In the embodiments illustrated in FIGS. 1-3, 8, and 9, the core 120 is configured as a shell-type transformer core because the primary and secondary windings 106, 108 are arranged about a central limb 122 of the core 120, while the core 120 considered as a whole, surrounds the coils 106, 108.

Figure 4:
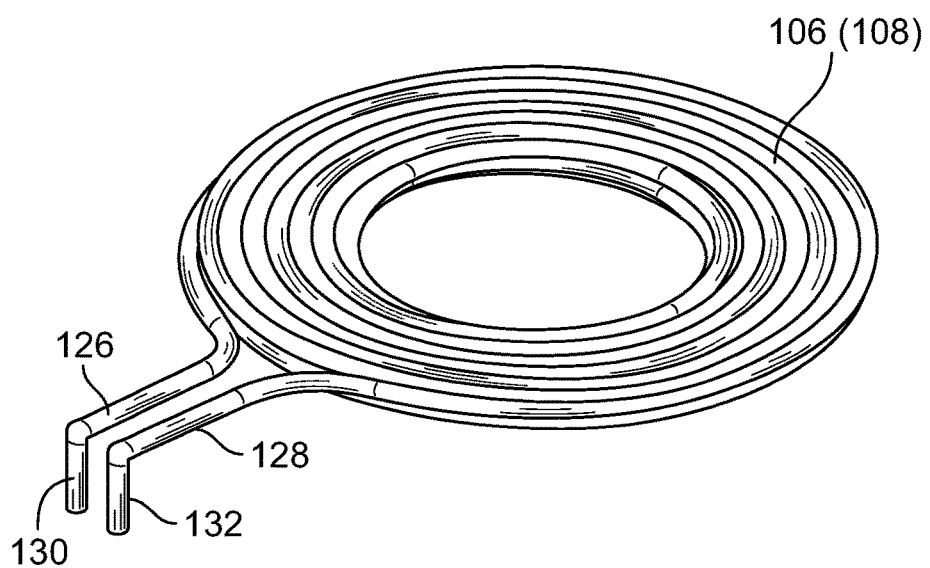
FIG. 4 is an isometric view of a coil from the hybrid transformer of FIG. 1.

The first coil 106 shown in FIG. 4 is a wire wound planar coil comprising a suitable conductor such as litz wire, solid triple insulated wire, or another suitable wire. The first and second coils 106, 108 may be made of the same material or differing materials depending upon specifics of example applications. Forming the coils 106, 108 from windable material reduces time-to-market as compared with conventional methods of fabricating windings directly into a PCB. Particularly safety schemes may specify that one of or both of the coils 106, 108 may be made from particular materials that facilitate adequate insulation between conducting portions thereof.

Referring still to the coil 106 shown in FIG. 4, the conductor is arranged into a planar coil thereby forming the interior opening 118. The winding of the coil 106 begins at a mutual starting point for both ends of the coil and is wound simultaneously in opposite directions. For example, to form a planar coil having twelve turns each side of such an example coil is looped or turned six times in both, opposing directions.

Figure 22:
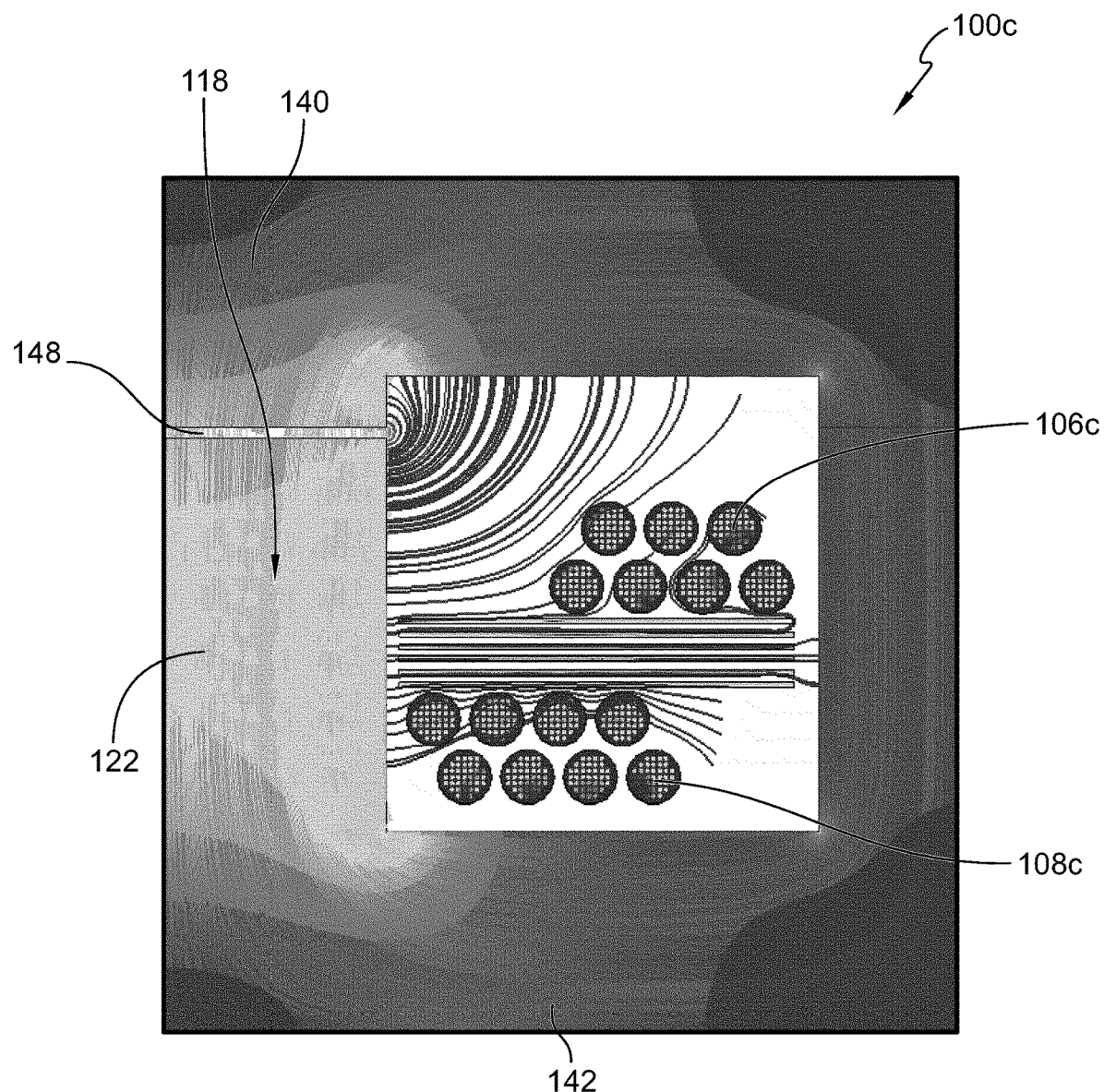
FIG. 22 is an enlarged cross-sectional view of one side of an offset coil, litz wire model example of the hybrid transformer, similar to that shown in FIG. 2, with magnetic flux lines superimposed on the image.
Figure 23:
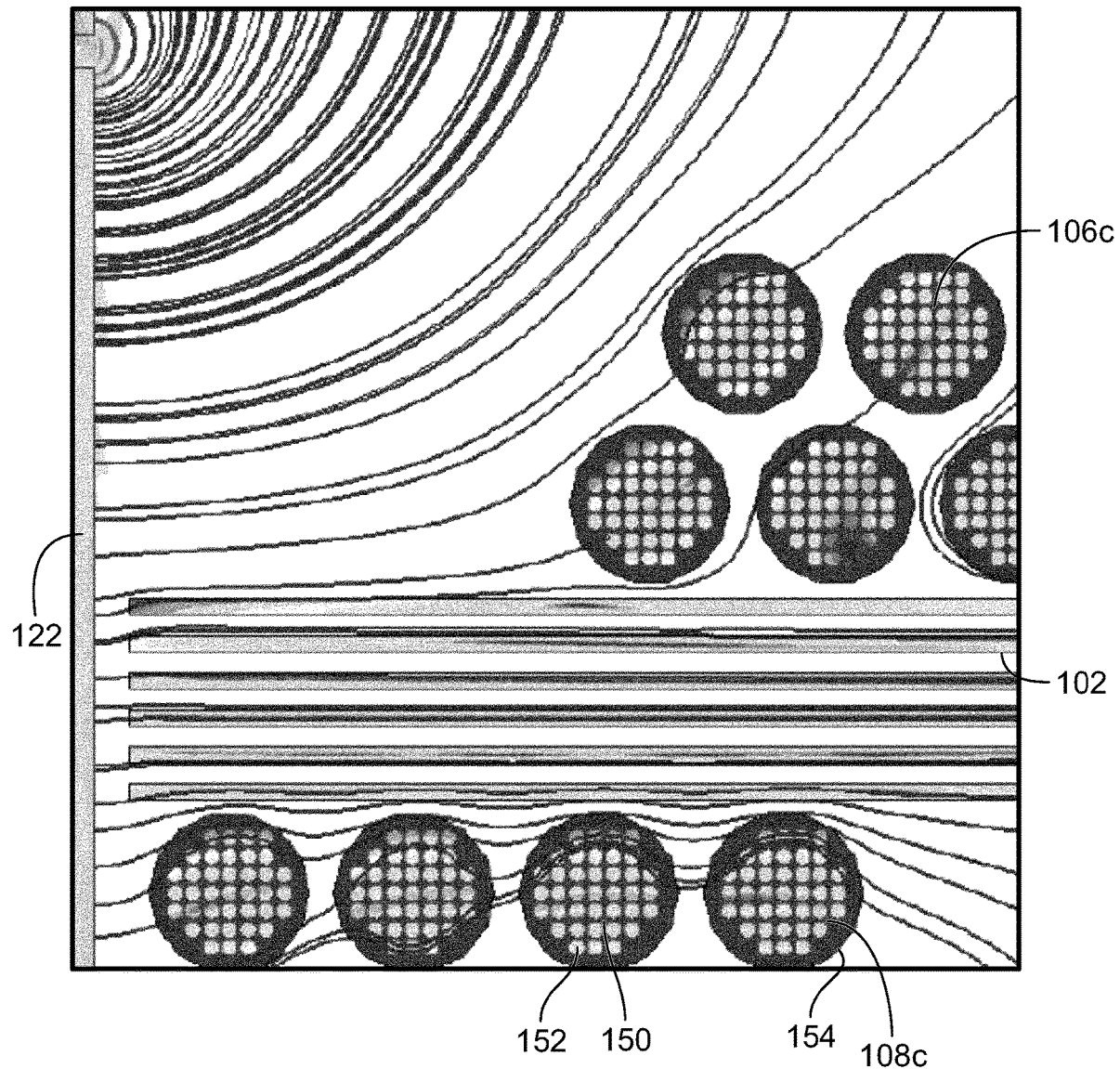
FIG. 23 is an enlarged cross-sectional view of the coil and insulator shown in FIG. 22.

For high frequency applications litz wire may be desirable. Also, in examples, triple insulated wire may be desirable for applications calling for reinforced isolation. The size and shape of the coils, 106, 108 may be easily customized. Referring ahead to FIGS. 22 and 23, a first coil 106c of that example embodiment is formed with a larger diameter than a second coil 108c. Alternative embodiments may include coils comprising rectangles, rounded rectangles, rounded triangles, ovals, ellipses, non-planar coils, and/or other suitable shapes depending upon the desired application. This feature further results in easy manipulation and customization of the first and second coils 106, 108 without necessitating changes to the PCB 102. For example, the configuration of FIGS. 22 and 23 may be manufactured on the same PCB 102 and about the same core 120 as the embodiment of FIGS. 1-3 or, referring ahead once again, FIGS. 8 and 9. Still further, a turns ratio between the first and second coils 106, 108 may be easily manipulated and customized without extensive, or any, change to the PCB 102.

Figure 5:
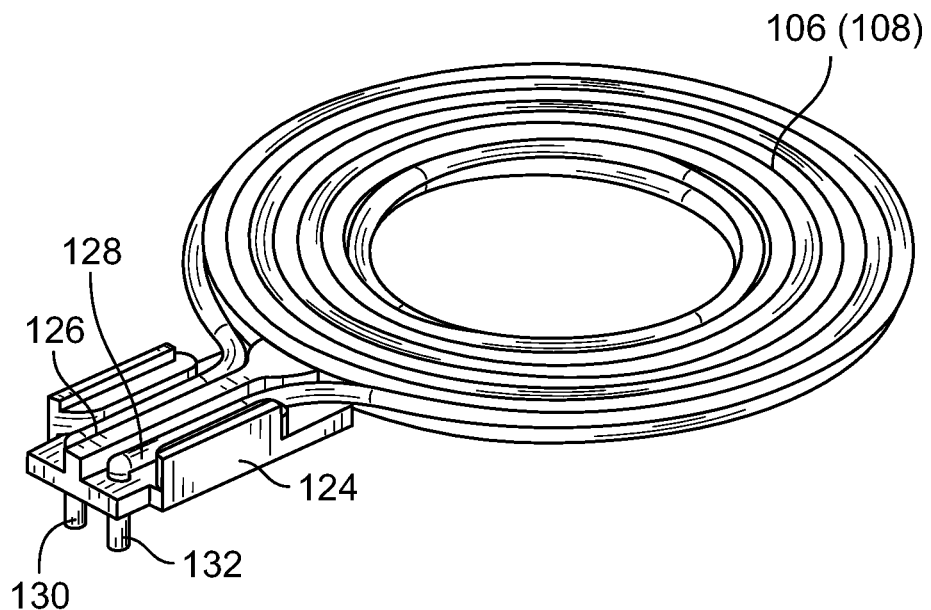
FIG. 5 is an isometric view of a header from the hybrid transformer of FIG. 1.

Additionally, the exemplary planar coil 106 may use self-adhesive wires to hold the shape of the coil 106, or tape may be employed to maintain the shape of the coil 106. First and second wire leads 126, 128 may be mounted to a header 124 with surface mount pins 130, 132 extending therefrom, as illustrated by FIG. 5. The header 124 insulates and maintains separation between the wire leads 126, 128 and the surface mount pins 130, 132. In exemplary embodiments, the header 124 is designed to meet clearance and creepage distances of the wire leads 126, 128 and the surface mount pins 130, 132 for compliance with applicable safety standards. The wire leads 126, 128 may operatively and electrically connect with the PCB 102 through the surface mount pins 130, 132 to through-hole or surface-mounted device (SMD) type connections on the PCB 102.

Figure 6:
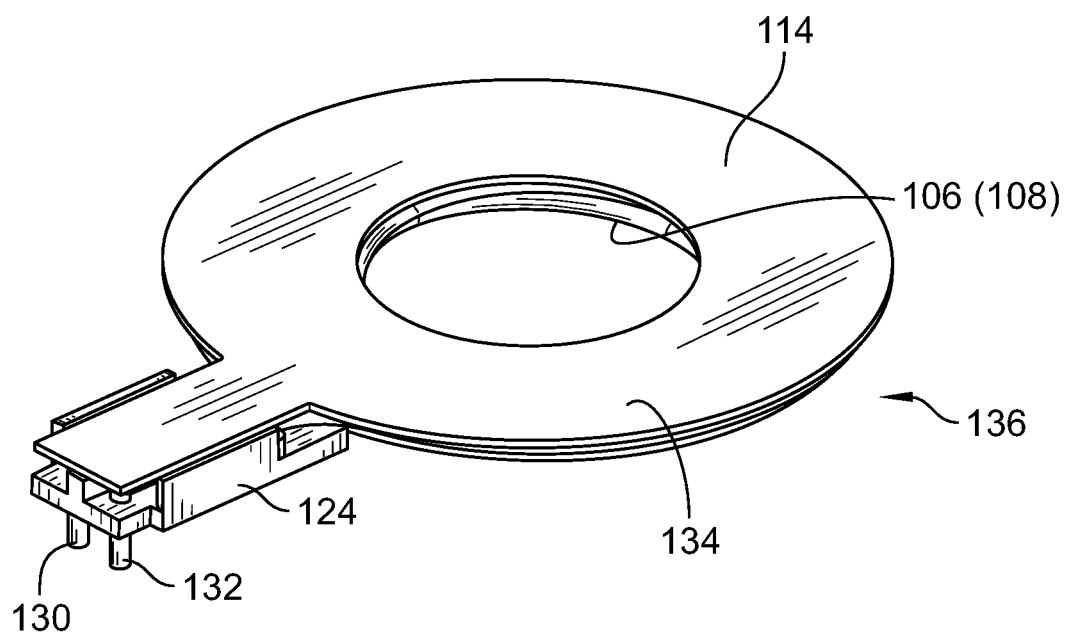
FIG. 6 is an isometric view of the header and coil of the hybrid transformer with an insulator disposed thereon.

Referring now to FIG. 6, the first insulator 114 is disposed on the first planar coil 106. The first insulator 114 may have a corresponding or complementary fit relative the header 124 such that the first and second wire leads 126, 128 are partially surrounded and/or encapsulated by a combination housing of the first insulator 114 and the header 124. The first and second insulators 114, 116 may be FR-4, Kapton, G-10, or another suitable material and/or board. The insulators 114, 116 disposed over the first and second coils 106, 108 supply a flat surface 134 for easy handling.

Combination of the coil 106, the header 124, and the first insulator 114 form a coil assembly 136. The flat surface 134 facilitates pick and place manufacturing of the coil assembly 136 during fabrication of the hybrid transformer 100. An analogous assembly 138 (see FIGS. 2 and 3) may be constructed from components associated with the second coil 116. During manufacturing, one or more of the coil assemblies 136, 138 may be picked and placed by machine (e.g., robot, automated arm, etc.) and surface mounted on one or another side of the PCB 102, as illustrated in FIG. 7.

Figure 7:
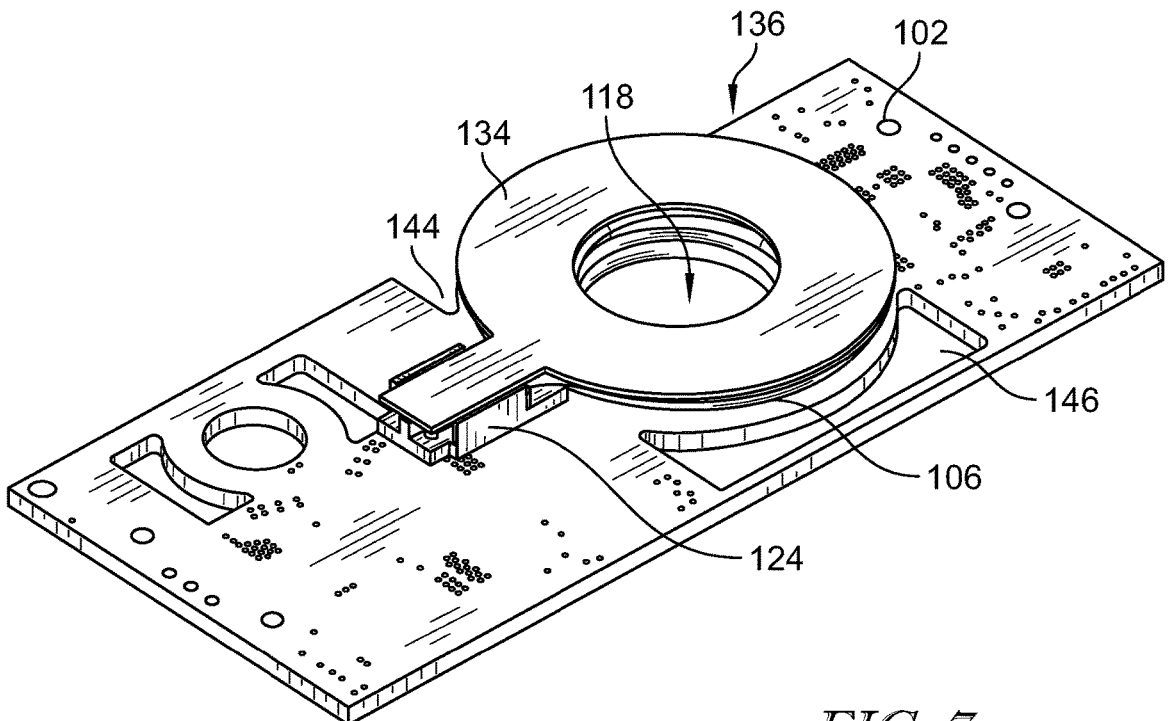
FIG. 7 is an isometric view of the header, coil, and insulator of a hybrid transformer disposed on a PCB.
Figure 8:
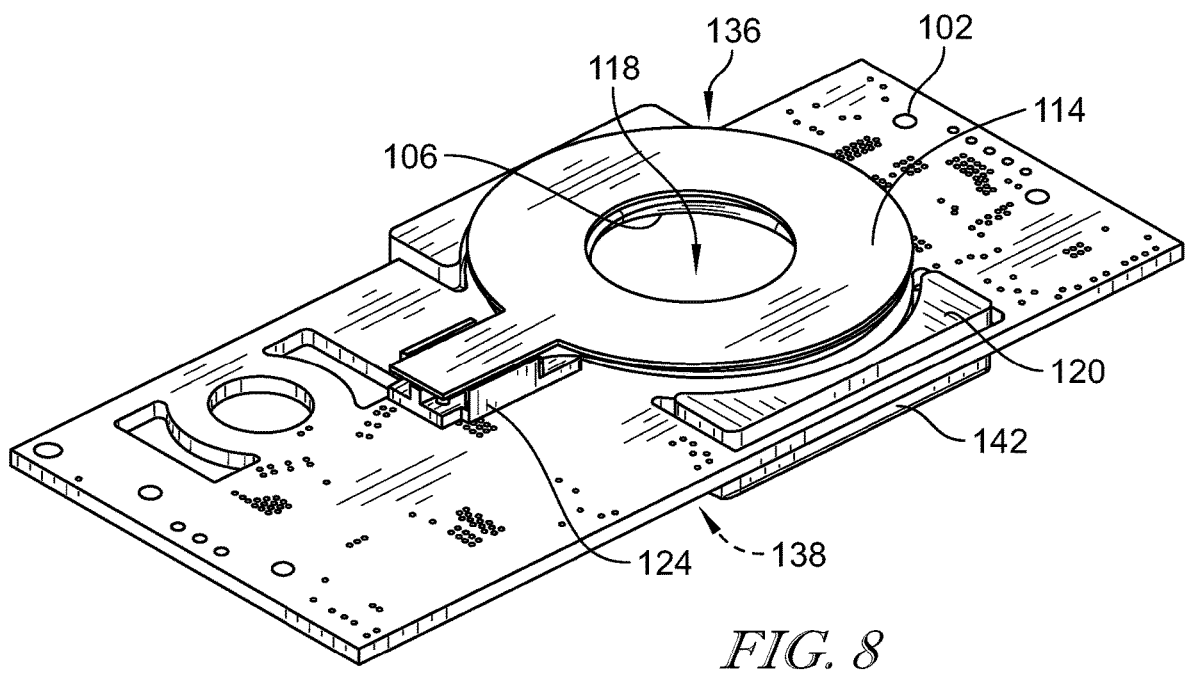
FIG. 8 is an isometric view of the header, coil, and insulator with a portion of a core disposed over a mirror image of the header, coil, and insulator arranged on an opposite side of the PCB.
Figure 9:
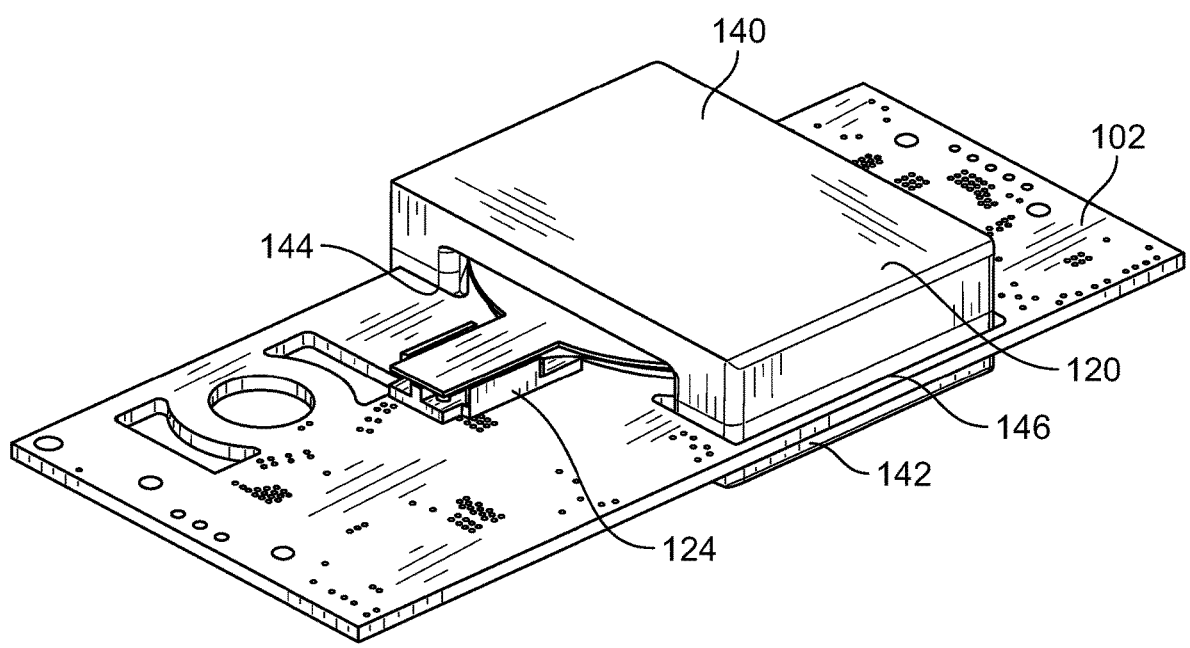
FIG. 9 is an isometric view of a hybrid transformer omitting other electrical components otherwise disposed on the PCB.

Referring now to FIGS. 7, 8, and 9, the coil assembly 136 is placed on the PCB 102, alongside the other electrical components 104 (see FIG. 1) and solder may be re-flowed to establish operative and electrical connections to the PCB 102. The core 120 is assembled about and through the first coil assembly 136 and the second coil assembly 138 (not shown in the view of FIGS. 7, 8, and 9). In the exemplary embodiment of FIGS. 8 and 9, the core 120 is assembled as two separate portions, a first portion 140 and a second portion 142. The second portion 142 is placed over and through the second coil assembly 138, i.e. on the underside of the view of FIGS. 8 and 9. In this embodiment, first and second side openings 144, 146 are disposed in the PCB 102 along the coil assemblies 136, 138. The second portion 142 of the core 120 has a shape that corresponds with the first and second side openings 144, 146 and the interior opening or passageway 118, which extends through the PCB 102 and the coils 106, 108 and the insulators 114, 116; and wherethrough the central limb 122 of the core 120 is disposed. The first portion 140 of the core 120 has a shape mirroring that of the second portion 142; but, in the illustrated embodiment of FIGS. 8 and 9, the first portion 140 does not extend through the PCB 102 to contact the second portion 142. Instead, the first and second portions 140, 142 meet within the interior passageway 118 relatively above the PCB 102 and inside a portion of the passageway 118 within the first coil assembly 136. The first portion 140 may be fixedly attached to the second portion 142 by soldering, adhesive, and/or another method suitable for connecting the core 120. The core 120 may substantially cover and/or surround an arcuate portion of the insulators 142, 144 and the coils 106, 108 as is typical for a shell-type transformer. Also, in examples, shown in FIGS. 1-3, the core may have a relatively thinner width co-extensive only with the interior opening 118 such that the insulators 142, 144 and the coils 106, 108 are still partially surrounding and covered by material of the core 120, but to a lesser extent than in the examples of FIGS. 8 and 9.

Figure 10:
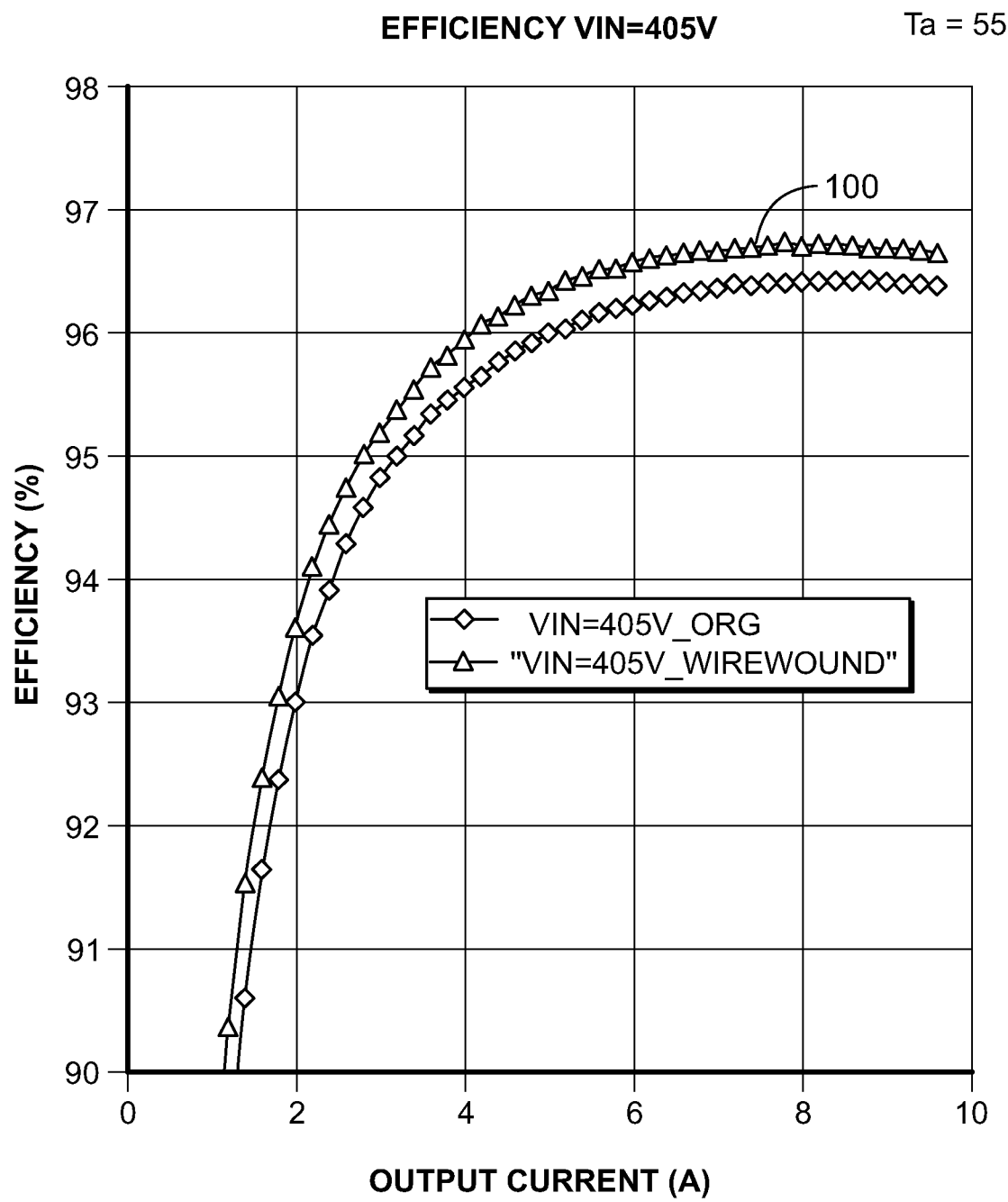
FIGS. 10, 11, and 12 are graphical charts showing efficiency plotted against output current for an example hybrid transformer according to the present disclosure and supplied with input voltages of 405V, 410V, and 415V respectively.
Figure 11:
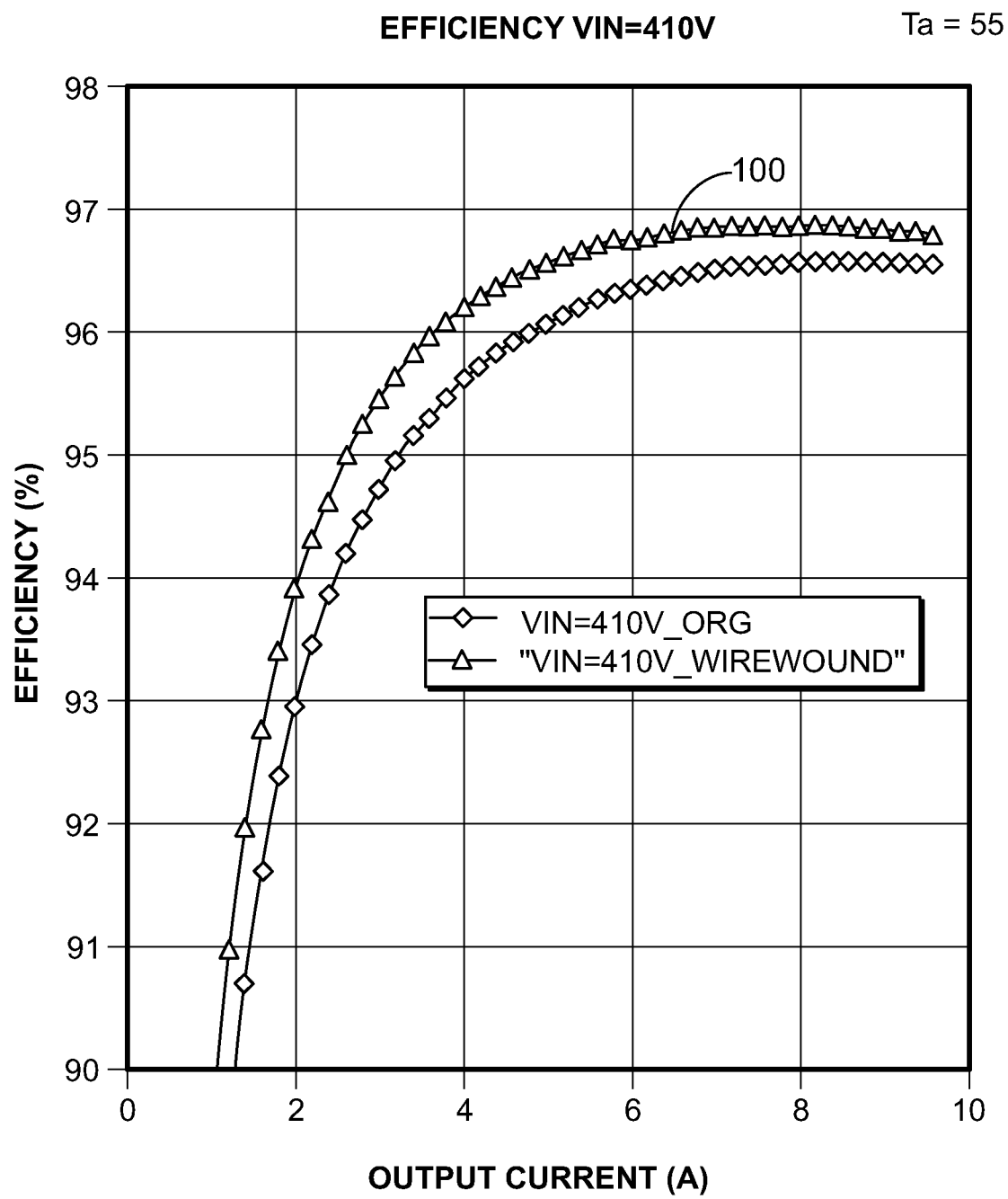
Figure 12:
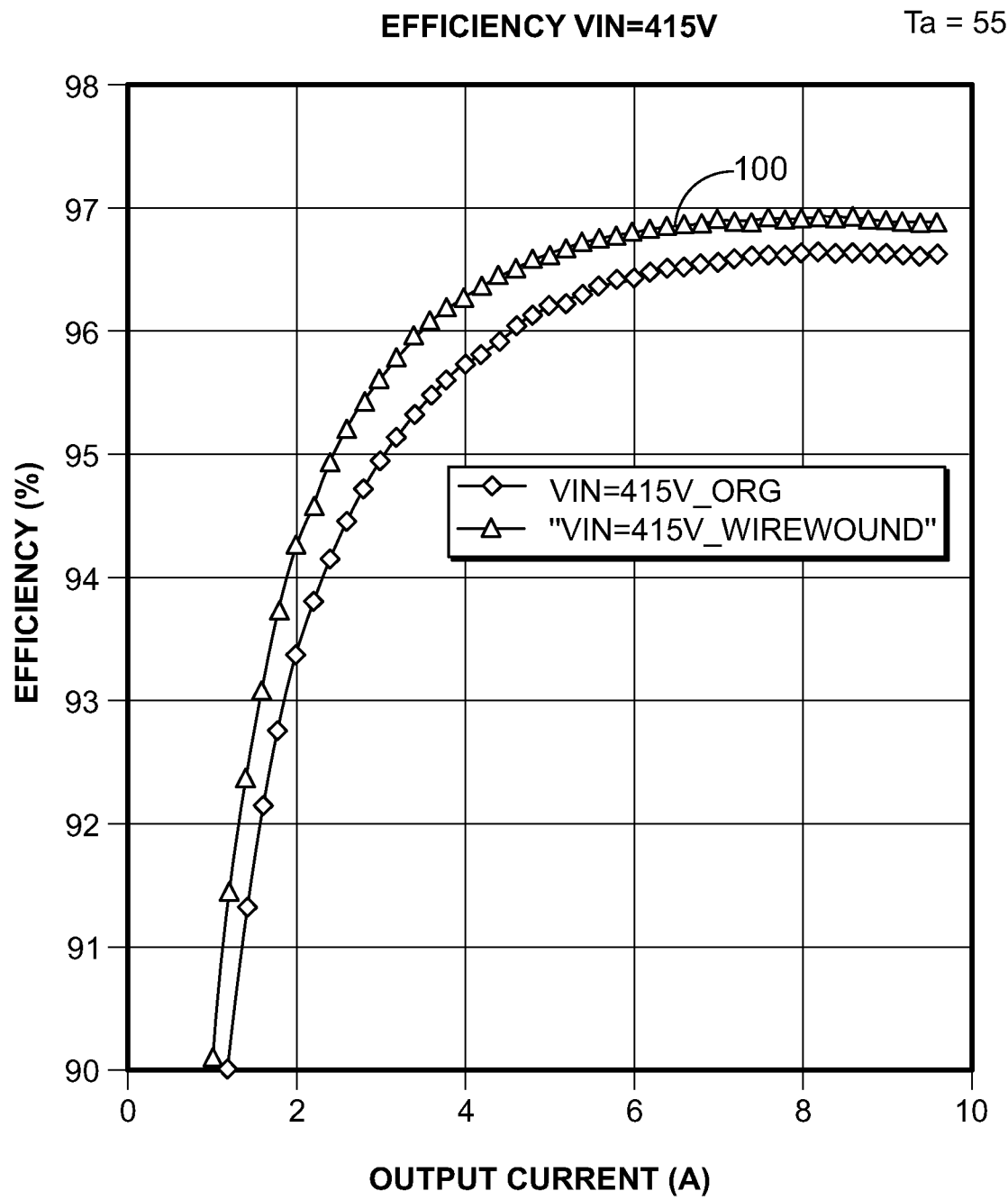

Referring now to FIGS. 10, 11, and 12, one improvement realized by the hybrid transformer 100 described by the present disclosure may be efficient conversion of a high input voltage $V_{in}$. FIG. 10 compares the efficiency of power conversion, when the $V_{in}$ is 405V, across a range of possible output currents from less than two amperes to approximately ten amperes of output current for an output voltage $V_o$ of 12V. It is notable that efficiency is improved by the hybrid transformer 100, as compared to conventional transformers, for each current output. Embodiments utilizing litz wire improve efficiency across a range of input voltage and load conditions as compared with solid wire windings. FIGS. 11 and 12 illustrate a similar trend in efficiency improvements for input voltages $V_{in}$ of 410V and 415V transformed to produce the same current output range as in FIG. 10.

Figure 13:
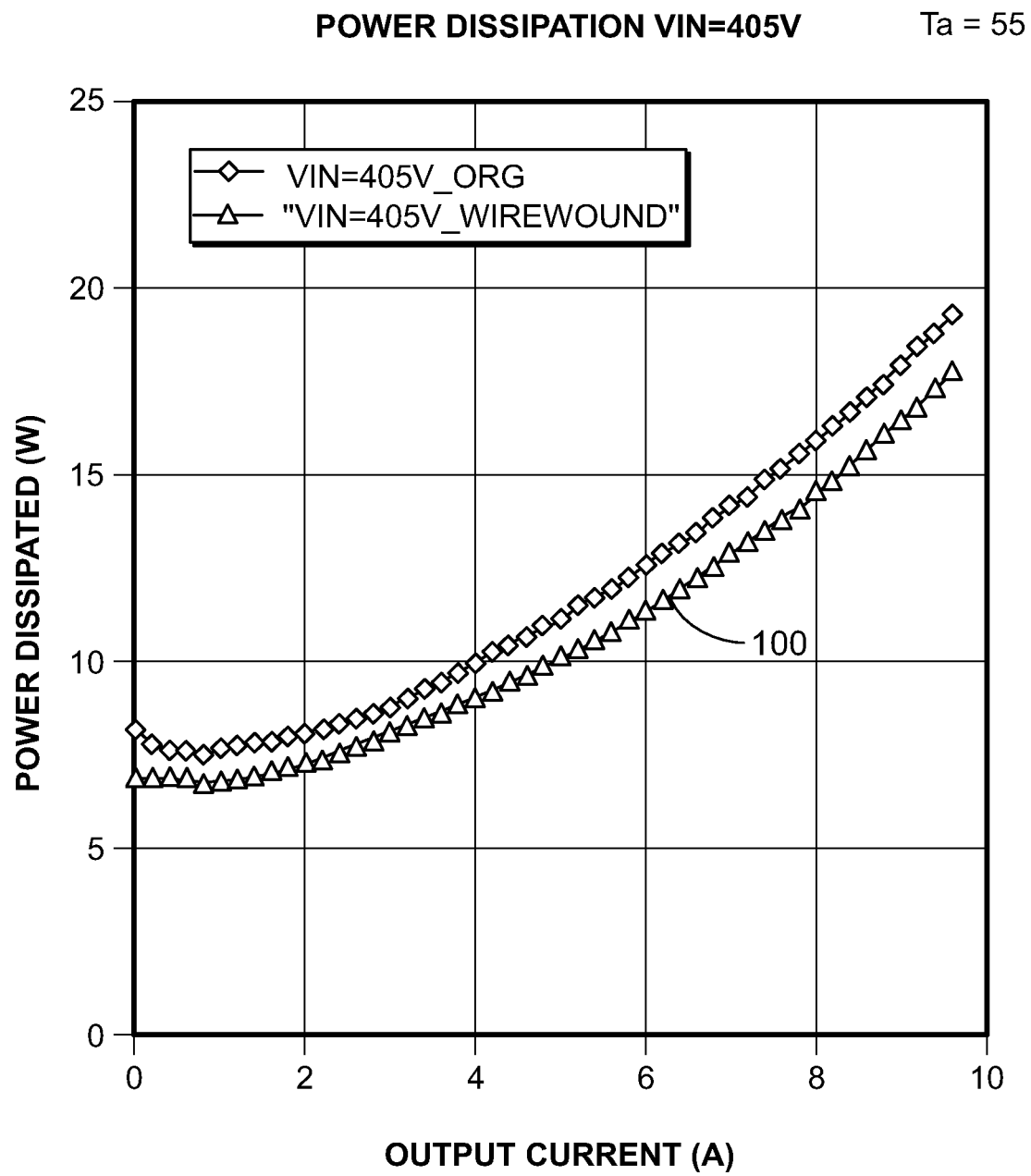
FIGS. 13, 14, and 15 are graphical charts showing power dissipation plotted against output current for an example hybrid transformer according to the present disclosure and supplied with input voltages of 405V, 410V, and 415V respectively.
Figure 14:
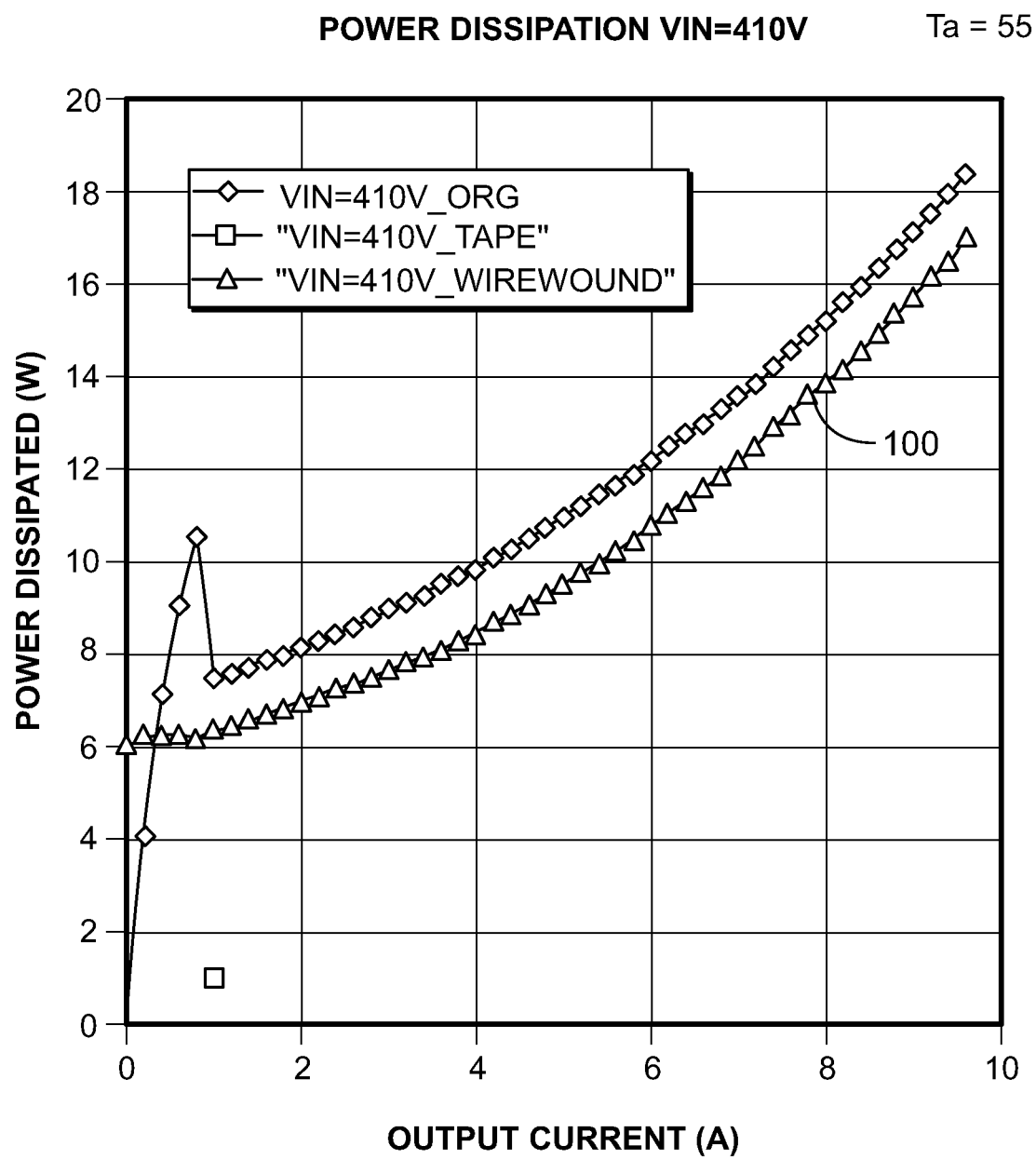
Figure 15:
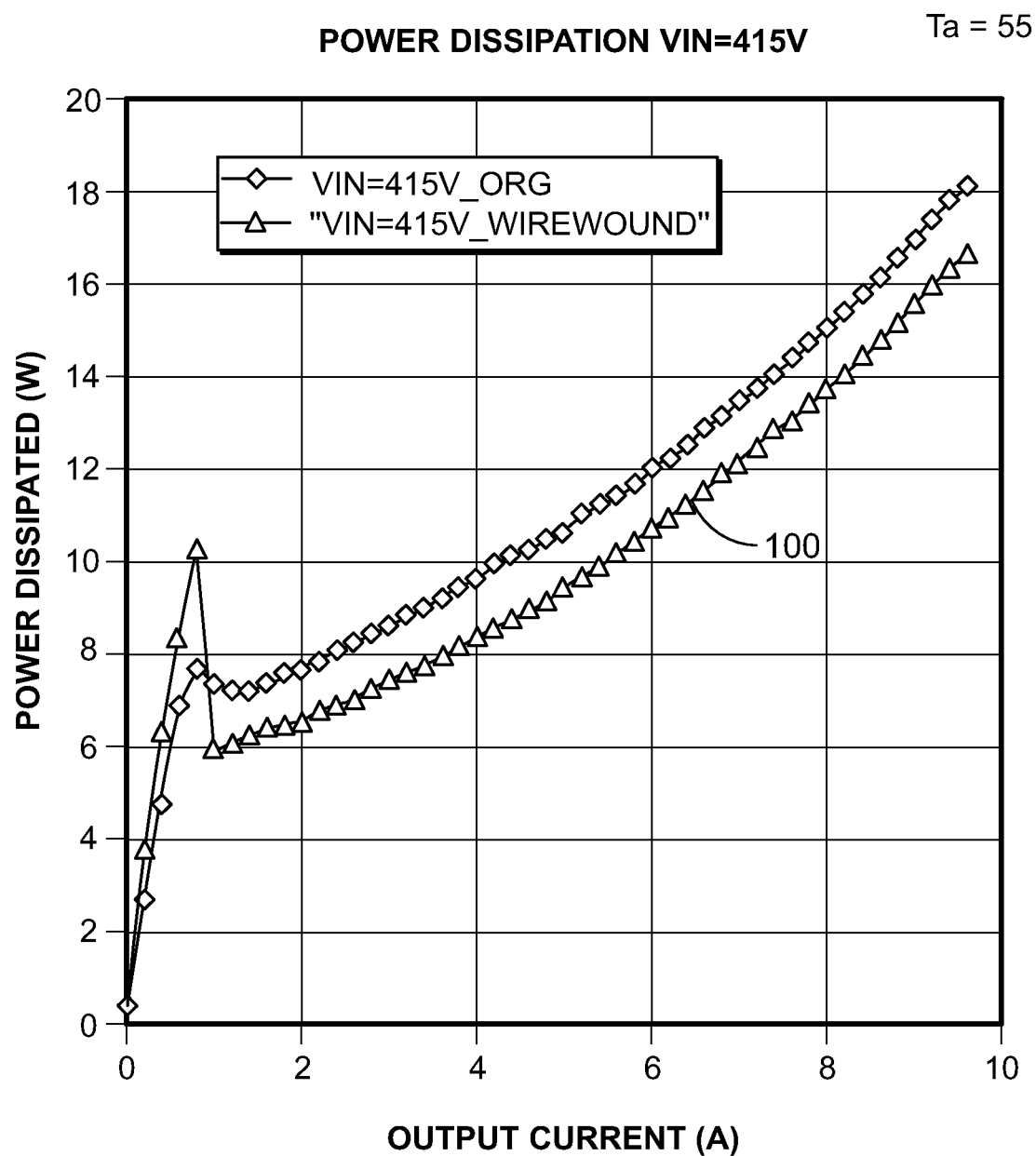

Referring now to FIGS. 13, 14, and 15, another improvement realized by the hybrid transformer 100 described by the present disclosure may be decreased power dissipation during conversion of a high input voltage $V_{in}$. FIG. 13 compares the power dissipated during power conversion when the $V_{in}$ is 405V across a range of possible output currents from less than two amperes to approximately ten amperes of output current for an output voltage $V_o$ of 12V. It is notable that power dissipation is improved, i.e., decreased, by the hybrid transformer 100, as compared to conventional transformers, for each current output. FIGS. 14 and 15 illustrate a similar trend in power dissipation improvements of approximately 1.25 watts to 1.5 watts for input voltages $V_{in}$ of 410V and 415V transformed to produce the same current output range as in FIG. 13.

Figure 2:
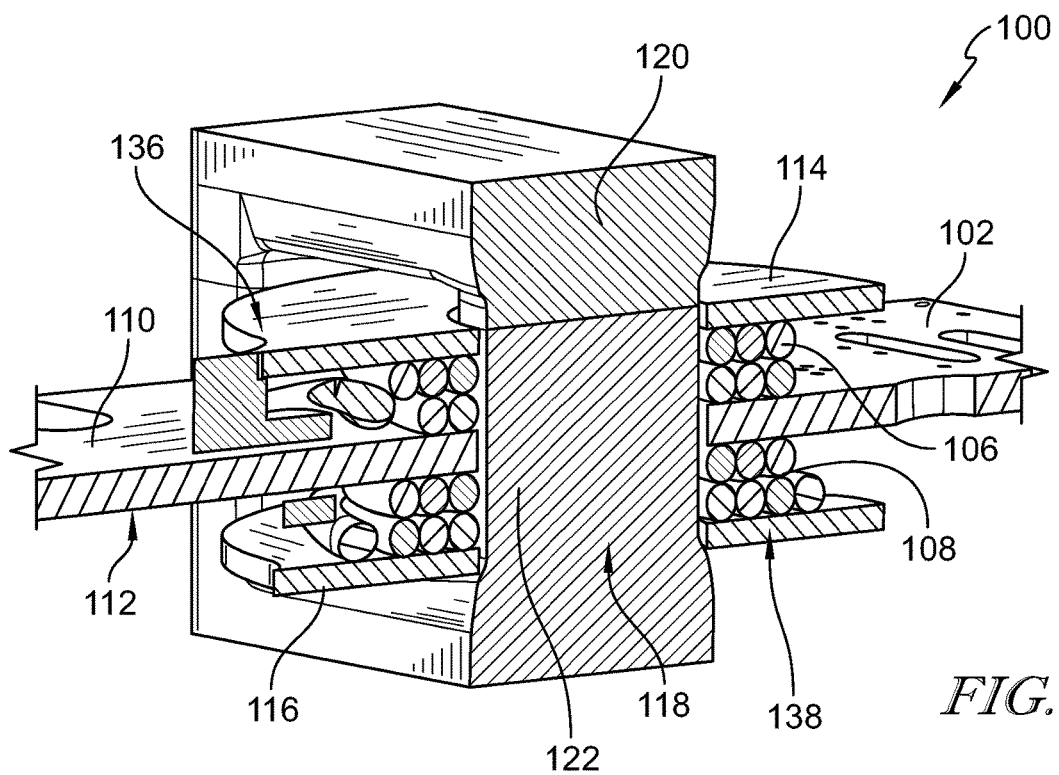
FIG. 2 is a cross-sectional view of the hybrid transformer taken along line 2-2.
Figure 3:
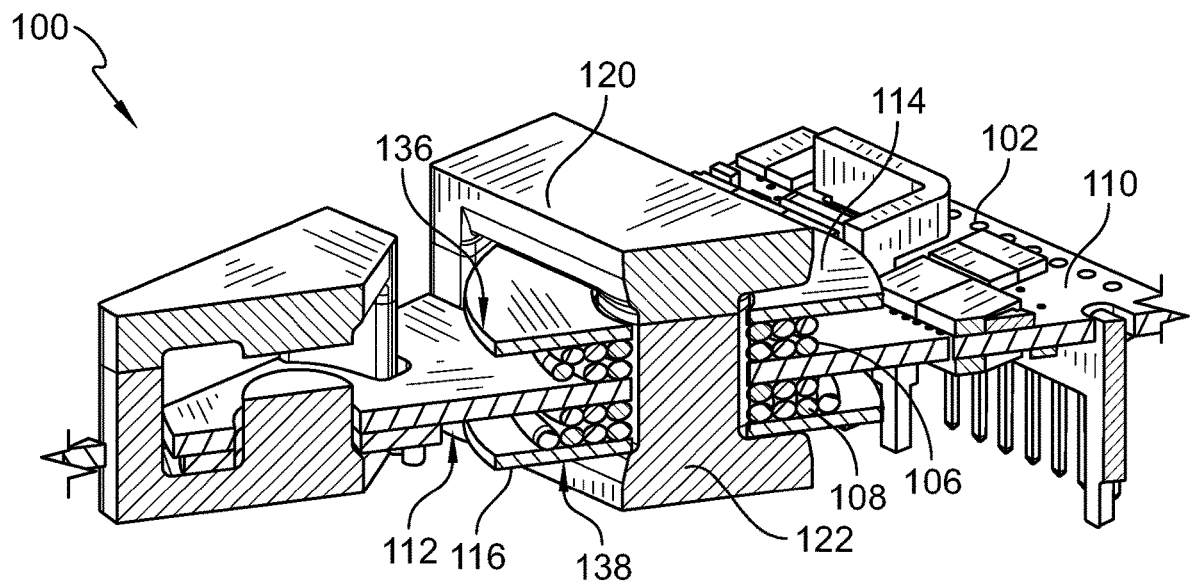
FIG. 3 is a another cross-sectional view of the hybrid transformer taken along line 3-3.
Figure 16:
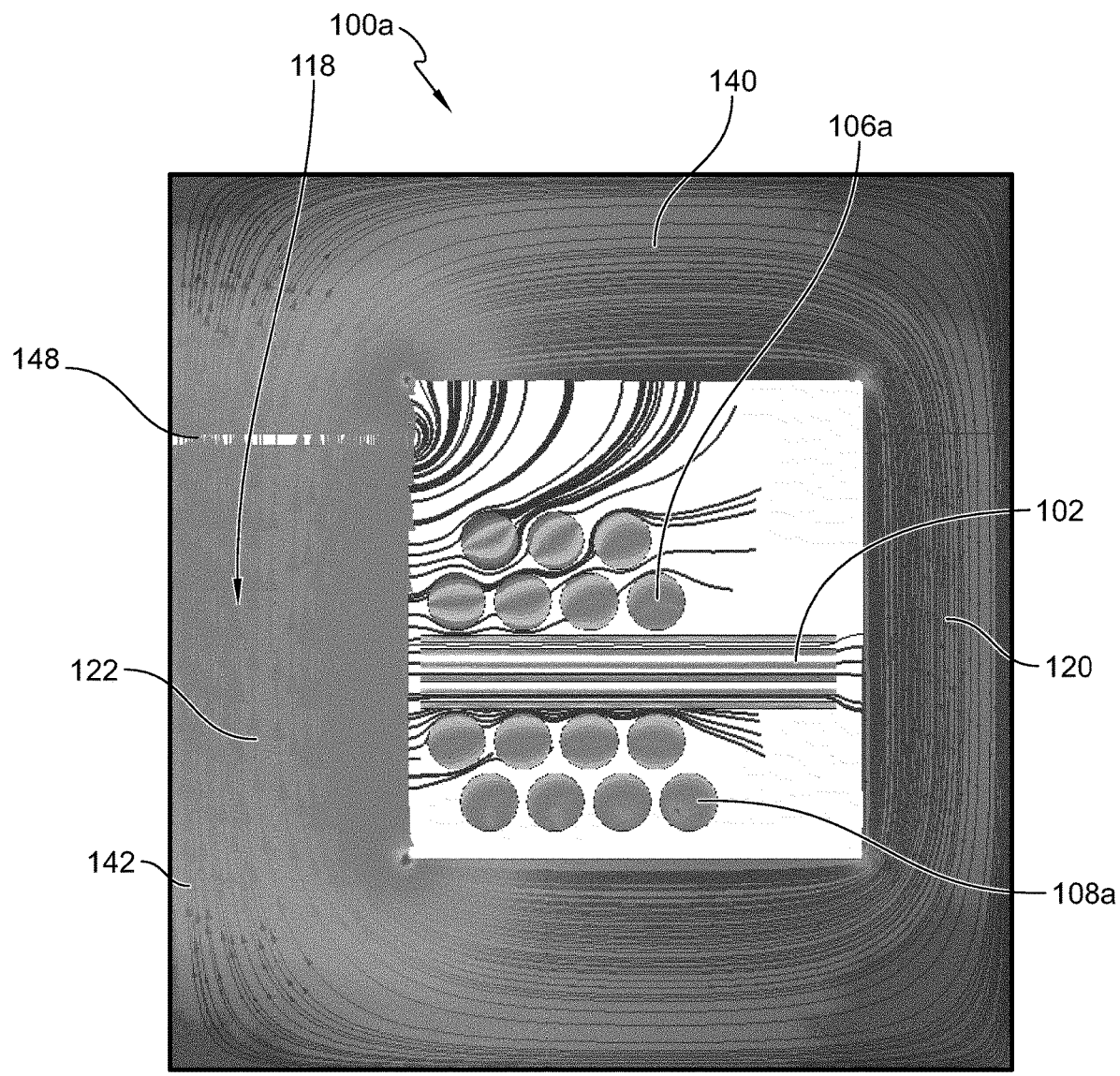
FIG. 16 is an enlarged cross-sectional view of one side of a solid wire model example of the hybrid transformer, similar to that shown in FIG. 2, with magnetic flux lines superimposed on the image.
Figure 17:
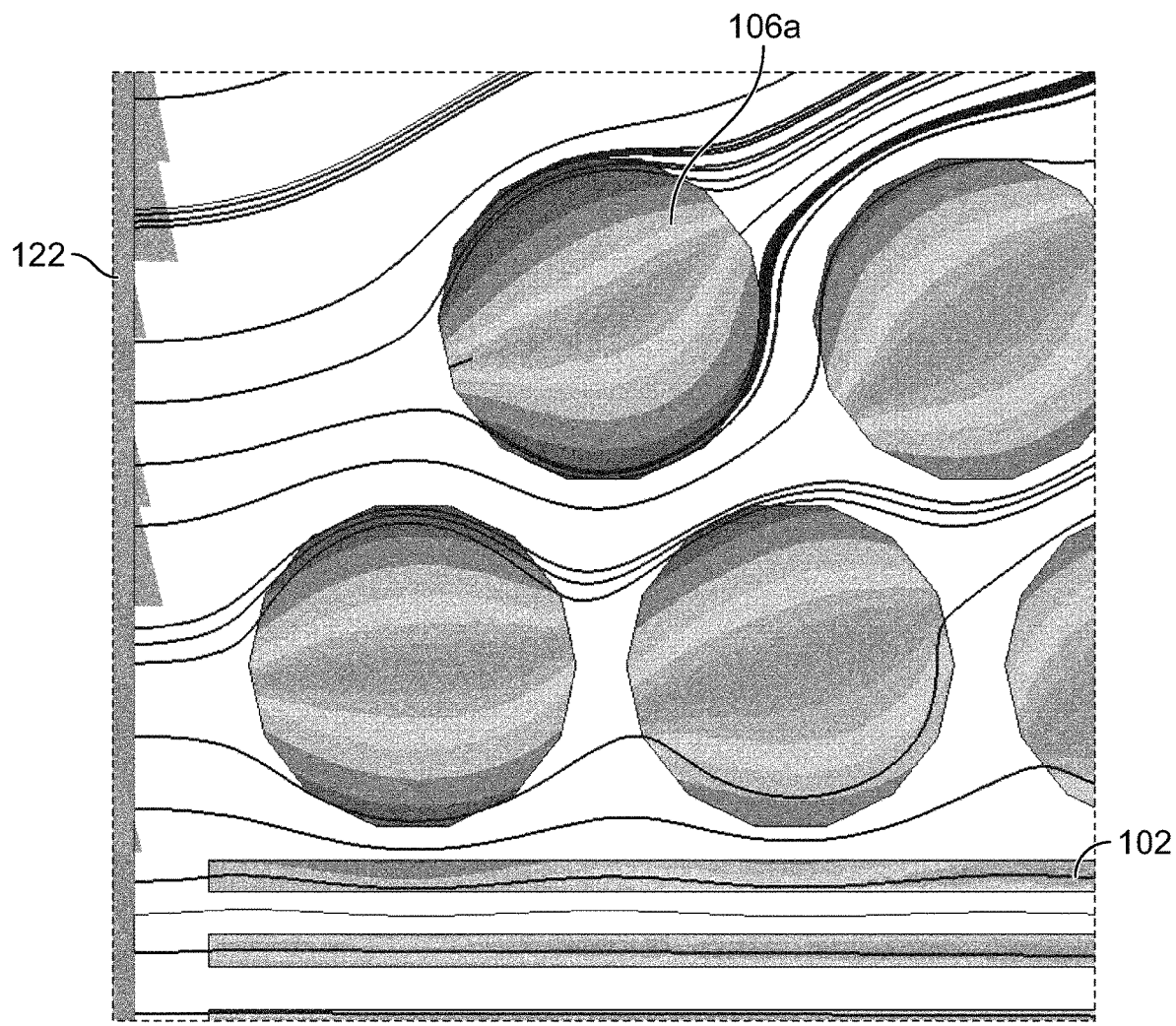
FIG. 17 is an enlarged cross-sectional view of the coil and insulator shown in FIG. 16.

FIG. 16 is an enlarged cross-sectional view of one side of a solid wire model embodiment 100a of the hybrid transformer 100, similar to the embodiment shown in FIG. 2, with magnetic flux lines superimposed on the image and coils 106a, 108a formed from solid copper wire. FIG. 17 shows a further enlarged, cross-sectional view of the coil 106a and the insulator 114 shown in FIG. 16. As noted hereinabove, the hybrid transformer 100 is a shell-type transformer, wherein the core 120 surrounds the primary and secondary windings 106a, 108a. In a shell-type transformer, magnetic flux concentrates on the central limb 122. This operation is illustrated in FIGS. 16 and 17, showing the central limb 122 of the core 120 experiencing relatively large magnetic flux within the passageway 118 through the first and second coils 106a, 108a. Current is prevented from flowing in the presence of magnetic flux. Furthermore, at high frequencies, current primarily travels near a surface of a wire because of the skin effect. The skin effect results in increased loss of power, particularly in high frequency applications such as typical applications of the presently disclosed hybrid transformer 100. A gap 148 in the central limb 122 of the core 120 between the first portion 140 and the second portion 142 is disposed at a location relatively removed from the primary and secondary windings 106a, 108a to minimize fringing loss generated thereby. The gap 148 is similarly located along the central limb 122 in the embodiments of FIGS. 19 and 22.

Stranded wire, such as litz wire, reduces negative outcomes from the skin effect by increasing the total surface area available for conduction as compared to the surface area of the equivalent solid wire. However, stranded wire may exhibit higher resistance than an equivalent solid wire of the same diameter because the cross-section of the stranded wire is not all copper; but, instead introduces gaps between the strands. Referring ahead to FIGS. 19, 20, 22, and 23, litz wire comprises gaps 150 between individual strands 152 and insulating material 154 (see FIGS. 22 and 23) surrounding each of the strands 152 partially fills the gaps 150.

Figure 18:
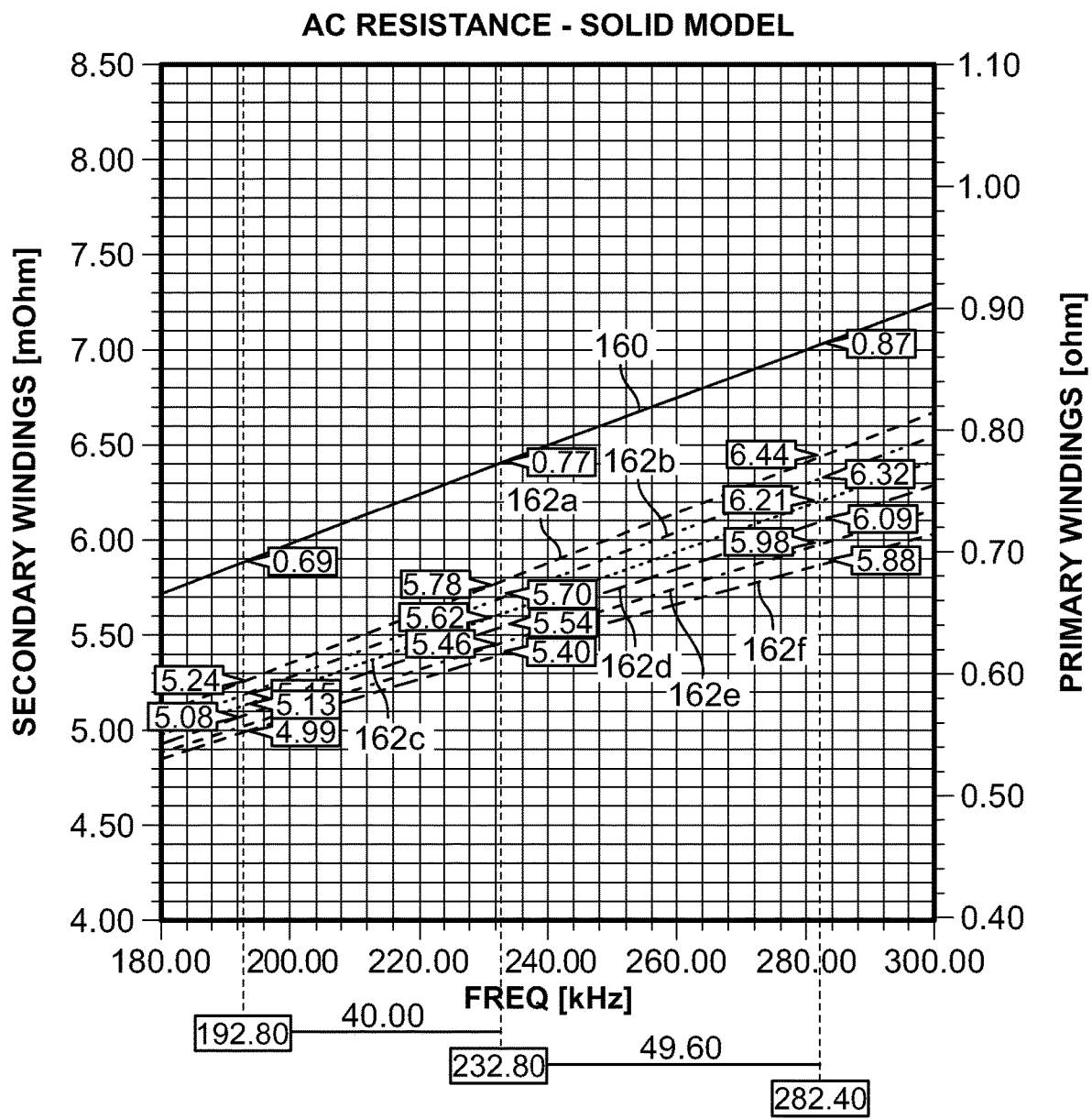
FIG. 18 is a graphical chart showing resistance plotted against frequency for the solid wire model of FIG. 16.

FIG. 18 is a graphical chart showing resistance plotted against frequency for the solid wire model shown in FIGS. 16 and 17. Simulated AC-AC resistance of the windings 106a, 108a is shown in FIG. 18 for the operating frequency range of an LLC converter of the solid wire model embodiment 100a of the hybrid transformer 100. A total AC resistance 160 of the primary winding 106a is shown in Ohms, and an AC resistance is shown in mOhms for each layer 162a-162f in the secondary winding 108a. The total AC resistance of the secondary winding 108a parallels all of the other illustrated resistance curves in the 5.6 mOhm range.

Figure 19:
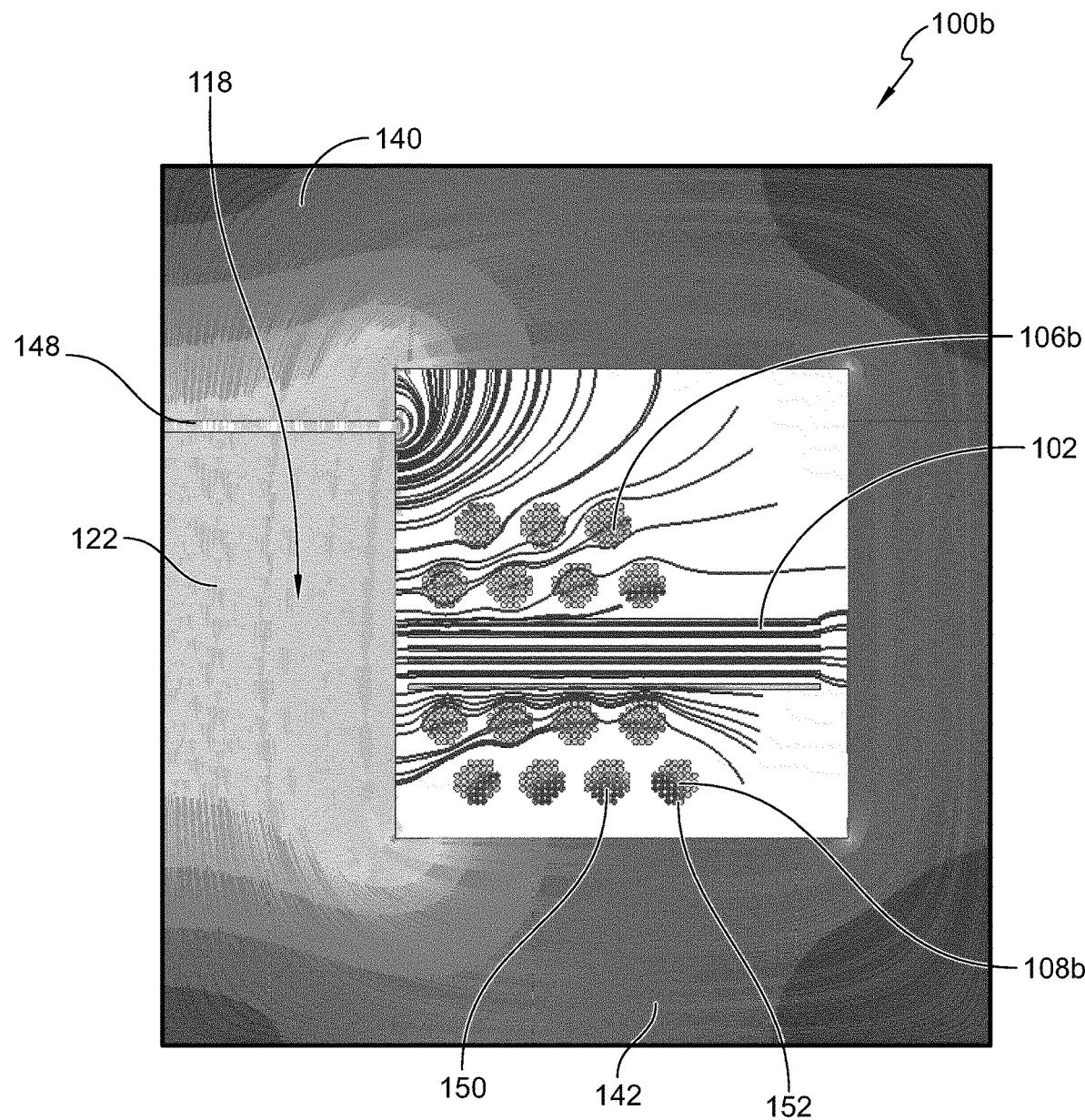
FIG. 19 is an enlarged cross-sectional view of one side of a litz wire model example of the hybrid transformer, similar to that shown in FIG. 2, with magnetic flux lines superimposed on the image.
Figure 20:
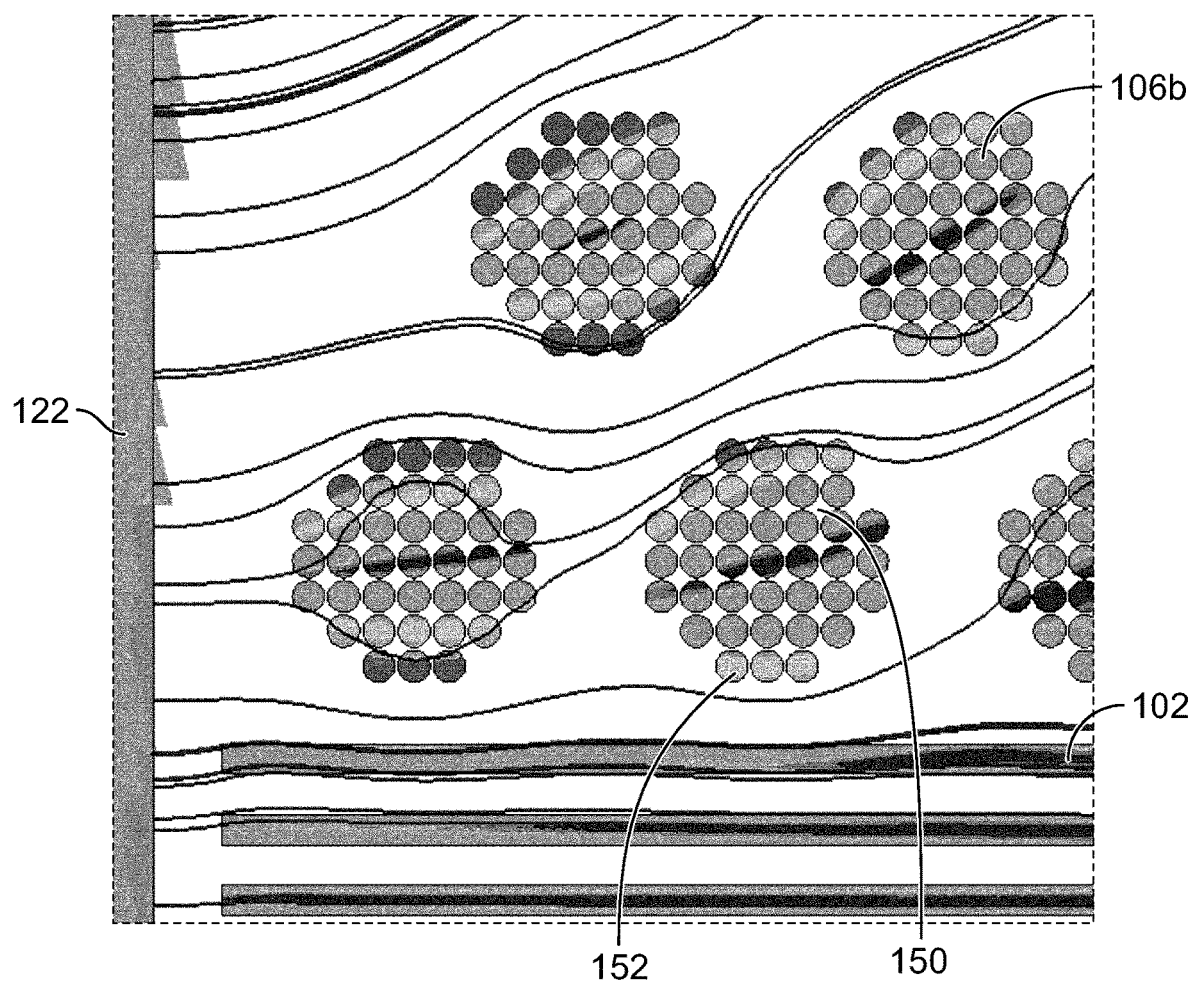
FIG. 20 is an enlarged cross-sectional view of the coil and insulator shown in FIG. 19.

FIG. 19 is an enlarged cross-sectional view of one side of a litz wire model embodiment 100b of the hybrid transformer 100, also similar to that shown in FIG. 2, with magnetic flux lines superimposed on the image and coils 106b, 108b formed from litz wire. For the purposes of simulation, it may be useful to simulate litz wire as comprising air gaps, rather than insulation, between each individual strand of the litz wire. Spacing between strands of the windings 106b, 108b influences the operation of the hybrid transformer 100. FIG. 20 is a further enlarged, cross-sectional view of the coil 106b shown in FIG. 19. The solid wire model 100a and the litz wire model 100b both are shown with a first, primary winding 106a, 106b, comprising a mean turn length of 1.63 inches. This results in the coils 106, 108 utilizing 2.03 feet of wire for 15 turns.

Figure 21:
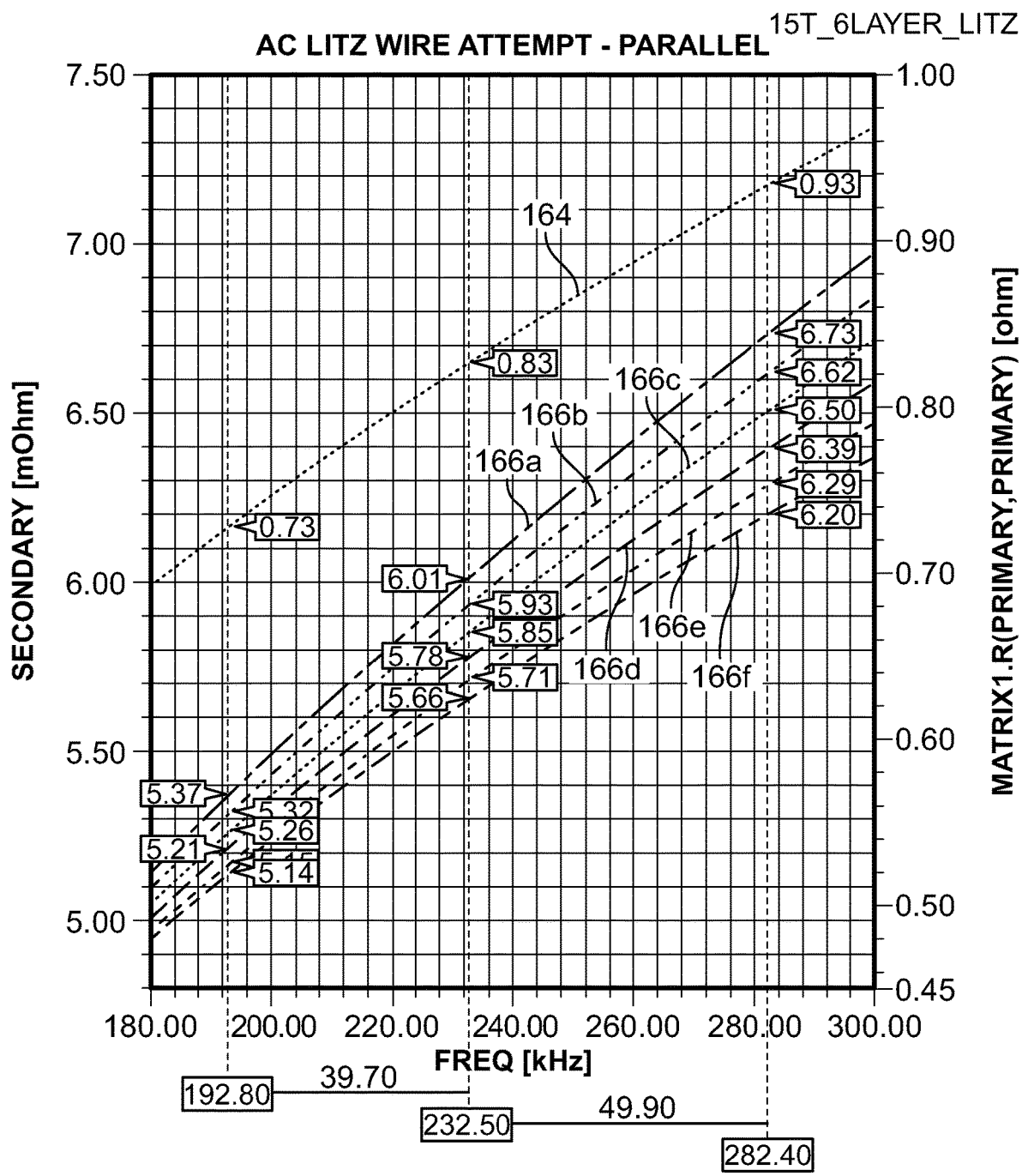
FIG. 21 is a graphical chart showing resistance plotted against frequency for the litz wire model of FIG. 19.

As noted hereinabove, the skin effect results in power loss, particularly at high frequencies. Litz wire introduces the insulated strands 152 to increase surface area with the objective of decreasing power loss. However, as can be seen in FIG. 21, which is a graphical chart showing resistance plotted against frequency for the litz wire model 100b of FIG. 19, resistance exhibited by the litz wire model 100b is similar to that of the solid wire model 100a. Simulated AC-AC resistance of the windings 106b, 108b is shown in FIG. 21 for the operating frequency range of an LLC converter of the litz wire model 100b. A total AC resistance 164 of the primary winding 106b is shown in Ohms, and an AC resistance of each layer 166a-166f in the secondary winding 108b is shown in mOhms. The total AC resistance of the secondary winding 108b parallels all of the individual illustrated resistance curves of the layers 166a-166f.

Figure 24:
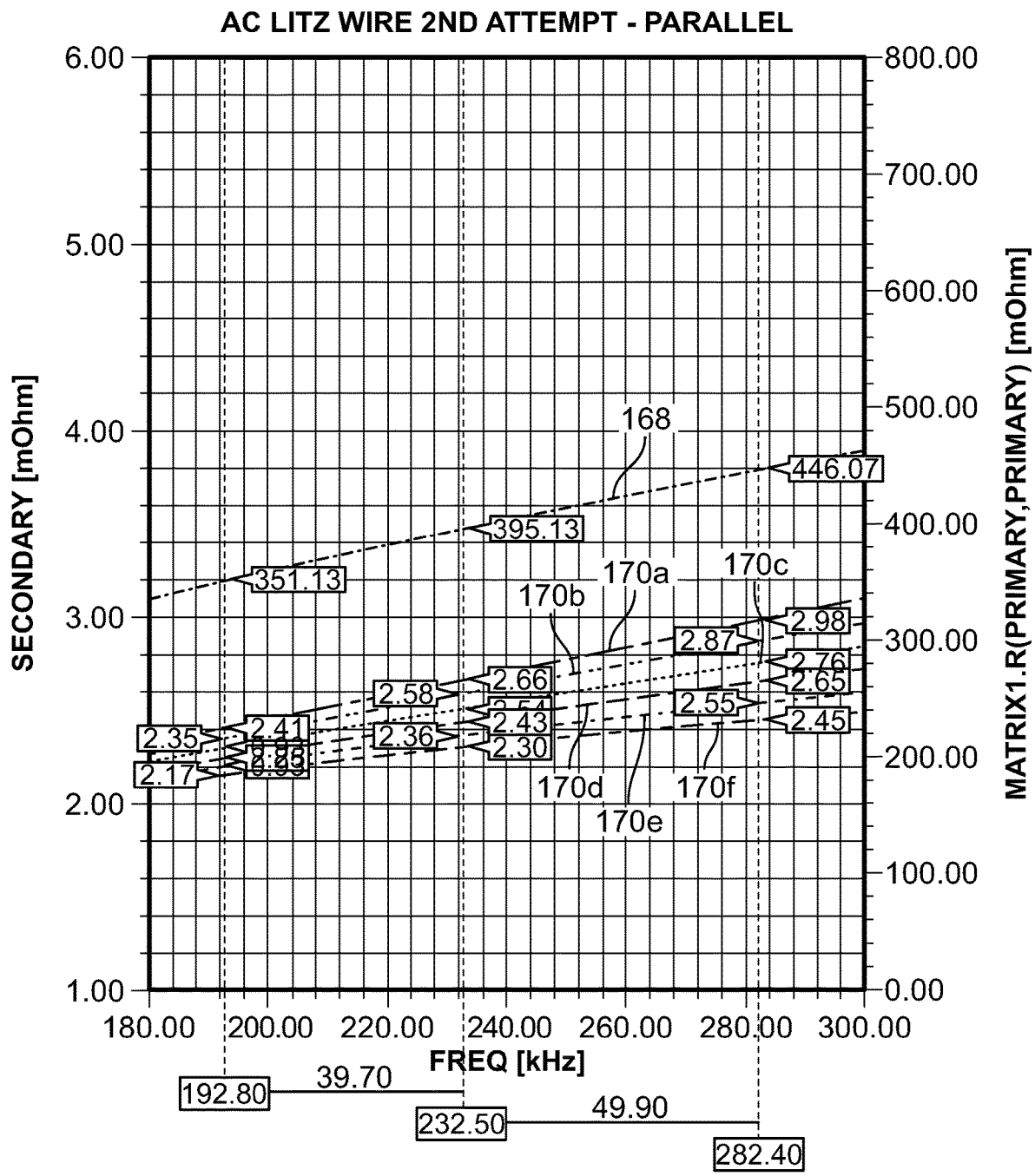
FIG. 24 is a graphical chart showing resistance plotted against frequency for the offset coil, litz wire model of FIG. 22.

FIG. 22 is an enlarged cross-sectional view of one side of a coil offset, litz wire model embodiment 100c of the hybrid transformer 100, also similar to that shown in FIG. 2, with magnetic flux lines superimposed on the image and coils 106c, 108c formed from litz wire. FIG. 23 is an enlarged cross-sectional view of the coil 106c, 108c and insulating material 154 shown in FIG. 22. Here, the primary coil 106c is offset relative the secondary coil 108c and separated from the central limb 122 of the core 120. In this embodiment, the primary winding 106c has a mean turn length of 2.22 inches and utilizes 2.38 feet of wire for 15 turns. FIG. 24 is a graphical chart showing resistance plotted against frequency for the offset, litz wire model of FIG. 22. In this example, the resistance experienced by the litz wire is considerably decreased by the offset arrangement. Simulated AC-AC resistance of the windings 106b, 108b is shown in FIG. 24 for the operating frequency range of an LLC converter of the coil offset, litz wire model embodiment 100c. A total AC resistance 168 of the primary winding 106c is shown in Ohms, and an AC resistance of each layer 170a-170f in the secondary winding 108c is shown in mOhms. The total AC resistance of the secondary winding 108c parallels all of the individual illustrated resistance curves of the layers 170a-170f.

The offset decreases interference with conduction of the coil 106c from magnetic flux by moving the coil 106c away from a region near the central limb 122 of the core 120 that experiences the strongest flux outside of the core 120. In exemplary embodiments, the first coil 106c is spaced farther from the central limb 122 of the core 120 than the second coil 108c. For example, the first coil 106c may be farther away from the central limb 122 radially than the second coil 108c. Alternatively, modifying the shape of one or both of the coils 106c, 108c may otherwise facilitate movement of the first coil 106c and/or the second coil 108c away from a region proximal the central limb 122 that experience an undesirable level of magnetic flux. In another example, the first coil 106c may be wound vertically, according to a stacked coil arrangement, and/or otherwise take a shape different from the planar coil shown hereinthroughout. In still other embodiments, both of the coils 106c, 108c may be spaced apart from the central limb 122 of the core 120, rather than adjacent the central limb 122 as illustrated in FIGS. 16 and 19. A number of desired turns for a particular coil may further be considered in determining the shape of the coils 106, 108.

The embodiment(s) detailed hereinabove may be combined in full or in part, with any alternative embodiment(s) described. While some implementations have been illustrated and described, numerous modifications come to mind without significantly departing from the spirit of the disclosure, and the scope of protection is only limited by the scope of the accompanying claims.

Headings and subheadings, if any, are used for convenience only and do not limit the embodiments. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The disclosed systems and methods are well adapted to attain the ends and advantages mentioned as well as those that are inherent therein. The particular implementations disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative implementations disclosed above may be altered, combined, or modified and all such variations are considered within the scope of the present disclosure. The systems and methods illustratively disclosed herein may suitably be practiced in the absence of any element that is not specifically disclosed herein and/or any optional element disclosed herein.

It should be understood that the described instructions, operations, and systems can generally be integrated together in a single software/hardware product or packaged into multiple software/hardware products.

The use of the terms "a" and "an" and "the" and "said" and similar references in the context of describing the embodiments (especially in the context of the following claims) are to be construed to cover both the singular and the plural, unless otherwise indicated herein or clearly contradicted by context. An element proceeded by "a," "an," "the,"

or "said" does not, without further constraints, preclude the existence of additional same elements. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

The invention claimed is:

1. A hybrid transformer comprising:
   first and second wire coils arranged on opposing sides of a printed circuit board (PCB), wherein the first and second wire coils are external to the PCB, wherein the first wire coil comprises a primary winding for the hybrid transformer, and wherein the second wire coil comprises a secondary winding for the hybrid transformer;
   a core extending through the PCB, wherein the first and second wire coils are each wound around the core;
   a first header configured to mount first wire leads of the first wire coil to a first side of the opposing sides of the PCB, the first wire leads of the first wire coil electrically coupling the first wire coil to the PCB; and
   a second header configured to mount second wire leads of the second wire coil to a second side of the opposing sides of the PCB, the second wire leads of the second wire coil electrically coupling the second wire coil to the PCB.

2. The hybrid transformer of claim 1, further comprising at least one insulator having a shape that corresponds with one of the first and second wire coils.

3. The hybrid transformer of claim 2, wherein the at least one insulator is combined with the one of the first and second wire coils forming a coil assembly and providing a flat surface of the one of the coil assembly.

4. The hybrid transformer of claim 3, wherein the flat surface of the coil assembly is axially distal from the PCB.

5. The hybrid transformer of claim 4, wherein the coil assembly is surface mounted on the PCB.

6. The hybrid transformer of claim 1, wherein the first and second wire coils are each one of stranded wire, litz wire, or solid wire.

7. The hybrid transformer of claim 1, wherein the first and second wire coils are each selected from among a plurality of coils having different sizes or shapes.

8. The hybrid transformer of claim 7, wherein a passageway is formed by the first wire coil, the second wire coil, and the PCB, and wherein a central limb of the core extends through the passageway.

9. The hybrid transformer of claim 8, wherein the first wire coil is larger than the second wire coil, and wherein the first wire coil is spaced farther from the central limb of the core than the second wire coil.

10. The hybrid transformer of claim 9, wherein a turns ratio of the hybrid transformer is customizable without changing the PCB.

* * * * *